United States Patent [19]

Maio et al.

[11] 4,340,882
[45] Jul. 20, 1982

[54] D/A CONVERSION SYSTEM WITH COMPENSATION CIRCUIT

[75] Inventors: Kenji Maio, Tokyo; Tsuneta Sudo, Kodaira, both of Japan

[73] Assignees: Nippon Telegraph and Telephone Public Corporation; Hitachi, Ltd., both of Tokyo, Japan

[21] Appl. No.: 889,559

[22] Filed: Mar. 23, 1978

[30] Foreign Application Priority Data

Apr. 6, 1977 [JP] Japan .................. 52-38519

[51] Int. Cl.³ .......................................... H03K 13/02
[52] U.S. Cl. ...................... 340/347 CC; 340/347 DA
[58] Field of Search .... 340/347 DA, 347 M, 347 CC; 318/632, 634; 360/78

[56] References Cited

U.S. PATENT DOCUMENTS

| 3,705,400 | 12/1972 | Cordes | 340/347 M |
| 3,735,392 | 5/1973 | Kaneko | 340/347 CC |
| 3,739,375 | 6/1973 | Chatelon | 340/347 CC |
| 3,860,861 | 1/1975 | Gucker | 360/78 |
| 3,881,184 | 4/1975 | Koepcke | 360/78 |
| 3,911,347 | 10/1975 | Hartung | 318/632 |
| 4,070,665 | 1/1978 | Glennon | 340/347 M |
| 4,099,113 | 7/1978 | Hayashi | 318/632 |
| 4,122,503 | 10/1978 | Allan | 318/634 |

OTHER PUBLICATIONS

Schulz, "IBM Technical Disclosure Bulletin", vol. 16, No. 1, Jun. 1973, pp. 137-138.
Rullgard, "IBM Technical Disclosure Bulletin", vol. 10, No. 1, Jun. 1967, pp. 5-6.

Primary Examiner—Charles D. Miller
Attorney, Agent, or Firm—Craig and Antonelli

[57] ABSTRACT

A D/A conversion system with a compensation circuit comprises a D/A converter for converting a digital input signal into an analog signal and a memory for storing a compensation data used for the compensation of the output of the D/A converter at an address corresponding to the digital input signal. The digital input signal is applied to the D/A converter and a signal corresponding to the digital input signal is applied to the memory. The output of the D/A converter is adjusted on the basis of the compensation data read out from the memory.

8 Claims, 14 Drawing Figures

D/A CONVERSION SYSTEM WITH COMPENSATION CIRCUIT

The present invention relates to a D/A (digital-analog) conversion system with a compensation circuit.

A D/A conversion system is commonly known in which, for example, individual bits of digital input applied to a D/A converter are converted into currents having predetermined weights, and the sum of these currents is then converted into an analog voltage. However, such a known D/A conversion system has had the disadvantage that the accuracy of D/A conversion tends to be degraded with time due to various variations including time-dependent variation of the weighted currents representing the individual bits.

In an effort to obviate such a disadvantage, a method has been proposed in which means are provided so that the weighted currents representing the individual bits can be subjected to fine adjustment so as to maintain the initial accuracy, and such fine adjustment is made at suitable time intervals so as to compensate the time-dependent variation of the weighted currents.

It is a recent tendency, however, to employ a D/A converter which forms part of a module or an integrated circuit as is commonly practised in this field. In such a case, it is not possible to deal with the variations including the time-dependent variation of the initial accuracy since the internal circuits of the module or integrated circuit cannot be adjusted. A D/A conversion system which overcomes the above difficulty is also commonly known in which an external weight compensation circuit is provided to compensate the weights for individual bits of a digital input, and the sum of the current supplied from the weight compensation circuit and the output current of the D/A converter in the module or integrated circuit is converted into an analog voltage. Adjustment in this known system is such that, while measuring the output voltage of the system by a high-accuracy voltmeter, the operator adjusts manually the variable resistors in the weight compensation circuit until the reading of the voltmeter attains the expected value for the input. However, such a D/A conversion system has been defective in that the system cannot be miniaturized since the weight compensation circuit itself cannot be formed as part of the module or integrated circuit. Further, this known D/A conversion system has had such an additional disadvantage that the setting of the variable resistors in the weight compensation circuit tends to become unstable due to temperature-dependent, time-dependent and other variations, and this results in undesirable degradation of the accuracy of D/A conversion. Furthermore, this known D/A conversion system has been defective in that the manual adjustment of the variable resistors in the weight compensation circuit is not only troublesome but also time-consuming.

It is therefore a primary object of the present invention to provide a novel and improved D/A conversion system which can be easily constructed in the form of a module or integrated circuit.

Another object of the present invention is to provide a D/A conversion system which can make the desired D/A conversion with very high accuracy.

A further object of the present invention is to provide a D/A conversion system in which compensation quantities can be automatically set.

According to one aspect of the present invention, there is provided a D/A conversion system comprising: input means for applying a digital signal as an input to the system; a D/A converter for converting the digital input signal applied from said input means into an analog signal; output means for receiving the analog signal applied from said D/A converter to provide an output of the system; memory means for storing a compensation data, used for the compensation of the analog signal appearing from said output means, at an address corresponding to the digital input signal; and compensation means for compensating the analog signal appearing from said output means on the basis of the compensation data read out from said memory means at the address corresponding to the digital input signal applied from said input means to said D/A converter, thereby to provide the compensated analog signal as the output of the system.

According to another aspect of the present invention, there is provided a D/A conversion system comprising: input means for applying a digital signal composed of n upper bits and m lower bits as an input to the system; a D/A converter for converting the digital input signal applied from said input means into an analog signal; output means for receiving the analog signal applied from said D/A converter to provide an output of the system; memory means for storing a compensation data, used for the compensation of the analog signal appearing from said output means, at an address corresponding to the upper bit portion of the digital input signal; adder means for adding the compensation data, read out from said memory means at the address corresponding to the upper bit portion of the digital input signal applied from said input means and the lower bit portion of the digital input signal; and signal applying means for applying the output signal of said adder means representing the result of addition to said D/A converter together with the upper bit portion of the digital input signal.

The above and other objects, features and advantages of the present invention will become more apparent from the following detailed description of preferred embodiments thereof taken in conjunction with the accompanying drawings, in which.

Figure 1:
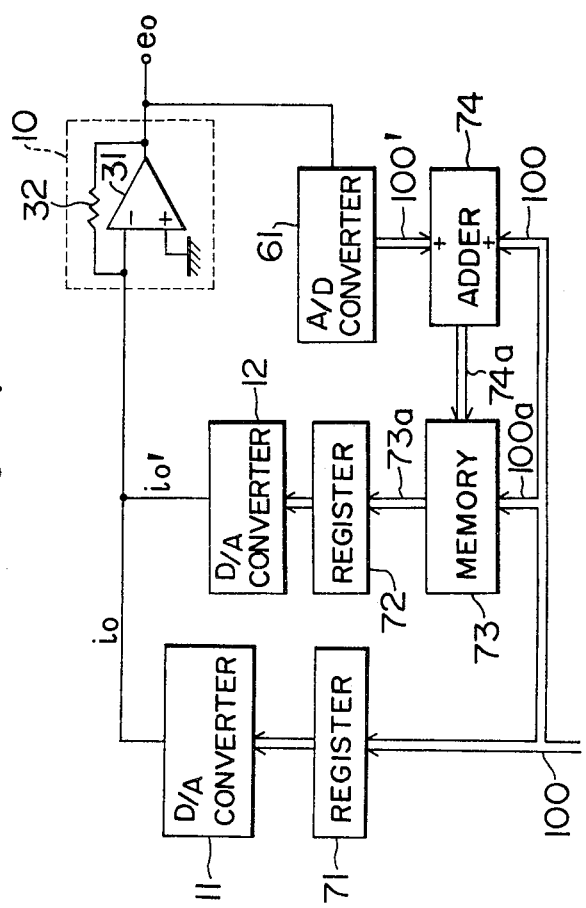
FIG. 1 is a block diagram showing the circuit structure of an embodiment of the D/A conversion system according to the present invention.

In FIG. 1 there is shown the structure of an embodiment of the D/A conversion system according to the present invention, and description will proceed with reference to the case in which a digital input signal of 10 bits is converted into an analog output signal.

It is generally acknowledged that, in an analog output signal provided as a result of D/A conversion of a digital input signal by a D/A converter, the output signal portion corresponding to the lower bits has relatively better linearity than the output signal portion corresponding to the higher bits. It is supposed herein that the output signal portion corresponding to the lower 6 bits has better linearity than the output signal portion corresponding to the higher 4 bits. It is supposed further that the maximum value of the linearity error in the output signal portion corresponding to the upper 4 bits may be approximately given by that of the decimal number represented by the lower 4 bits (=15 LSB). This LSB means the least significant bit and is used herein to represent the minimum unit of a digital data.

Under the conditions above specified, the structure and operation of the first embodiment of the D/A conversion system according to the present invention will be described with reference to FIG. 1. Referring to FIG. 1, a suitable digital data input signal 100 of 10 bits is applied through a register 71 to a 10-bit D/A converter 11, and its output current $i_o$ is converted into an analog voltage $e_o$ by a C/V (current-voltage) converter 10. This C/V converter 10 is comprised of an amplifier 31 and a feedback resistor 32. The analog voltage $e_o$ is then converted into a digital signal 100' by a high-accuracy A/D (analog-digital) converter 61, and this digital output signal 100' is applied to a digital adder 74 which detects the difference 74a between the digital data input signal 100 applied thereto and the digital output signal 100' of the A/D converter 61. (The addition provides the difference between the data input signal 100 and the output signal 100' of the A/D converter 61 since they have opposite signs.) From the aforementioned supposition on the magnitude of the linearity error, the digital signal 74a representing the difference between the data input signal 100 and the output signal 100' of the A/D converter 61 can be expressed to be composed of 5 bits which include a sign bit in addition to 4 bits. This digital differential signal 74a composed of the sign bit plus the 4 bits is stored in a memory 73 at an address corresponding to the decimal number represented by the higher 4-bit portion 100a of the digital data input signal 100. A similar operation is carried out on all the combinations of the higher 4 bits of the digital data input signal so that all the differential signals representing the measured digital differential quantities can be successively written in the memory 73 at the corresponding addresses provided by the individual combinations of the higher 4 bits of the digital data input signal. During the above period, the output of the memory 73 is inhibited from being applied through a register 72 to a 5-bit D/A converter 12 for compensation described later, since the register 72 and D/A converter 12 is now disconnected from the operating circuit.

After the operation above described has been completed, the D/A conversion system is placed in its normal operating state for D/A conversion. In this case, the register 72 and D/A converter 12 are placed in their operable state, while the A/D converter 61 and adder 74 are placed in their nonoperable state.

In response to the application of a digital input signal 100 to be subjected to D/A conversion, a suitable compensation data 73a for compensating the analog output signal of the D/A converter 11 is read out from the memory 73 depending on the data portion 100a provided by the higher 4 bits of the digital input signal 100, and such a compensation data 73a is set in the register 72. On the basis of the compensation data 73a registered in the register 72, the 5-bit compensation D/A converter 12 supplies a compensation current $i_o'$ which is added to the output current $i_o$ of the 10-bit D/A converter 11, and the sum of $i_o$ and $i_o'$ is converted into a corresponding voltage by the C/V converter 10. Therefore, the C/V converter 10 provides an output $e_o$ in which the linearity error of the upper 4-bit portion 100a of the digital input signal 100, which may amount to 15 LSB as described hereinbefore, is fully compensated. The registers 71 and 72 are provided for synchronizing the timing of application of digital data inputs to the D/A converters 11 and 12. The memory 73 is preferably of the non-volatile type so as to eliminate the necessity for writing the compensation data into the memory 73 again after cut-off of the power supply.

It is needless to say that control circuits are necessary for the write-read control of the memory 73, for the control of the operation of the elements such as the D/A converter 12 and A/D converter 61, and for other control purposes. However, these control circuits are not illustrated in FIG. 1 as they are of the conventional structure well known in the art and have no direct concern with the present invention.

It will be understood from the above description of the first embodiment of the present invention that the D/A conversion system requires merely additional provision of digital elements, such as a digital memory and a digital adder, and a D/A converter of a small number of bits, such as a 5-bit D/A converter, and can thus be very easily provided in the form of a module or an integrated circuit.

Further, the storage of the compensation data in the digital memory is advantageous in that these data are substantially free from temperature-dependent, time-dependent and other variations, and the D/A conversion can be effected with very high accuracy.

Furthermore, due to the fact that the compensation data used for compensation of individual digital inputs can be automatically provided by the combination of the elements including the A/D converter and adder, the labor and time required for providing the compensation data can be greatly reduced.

It is to be noted that the linearity of the output of the D/A conversion system is not affected by the provision of the compensation D/A converter 12 since it handles merely the compensation data of 4 bits plus the sign bit of 1 bit used for the compensation of the output of the D/A converter 11.

Figure 2:
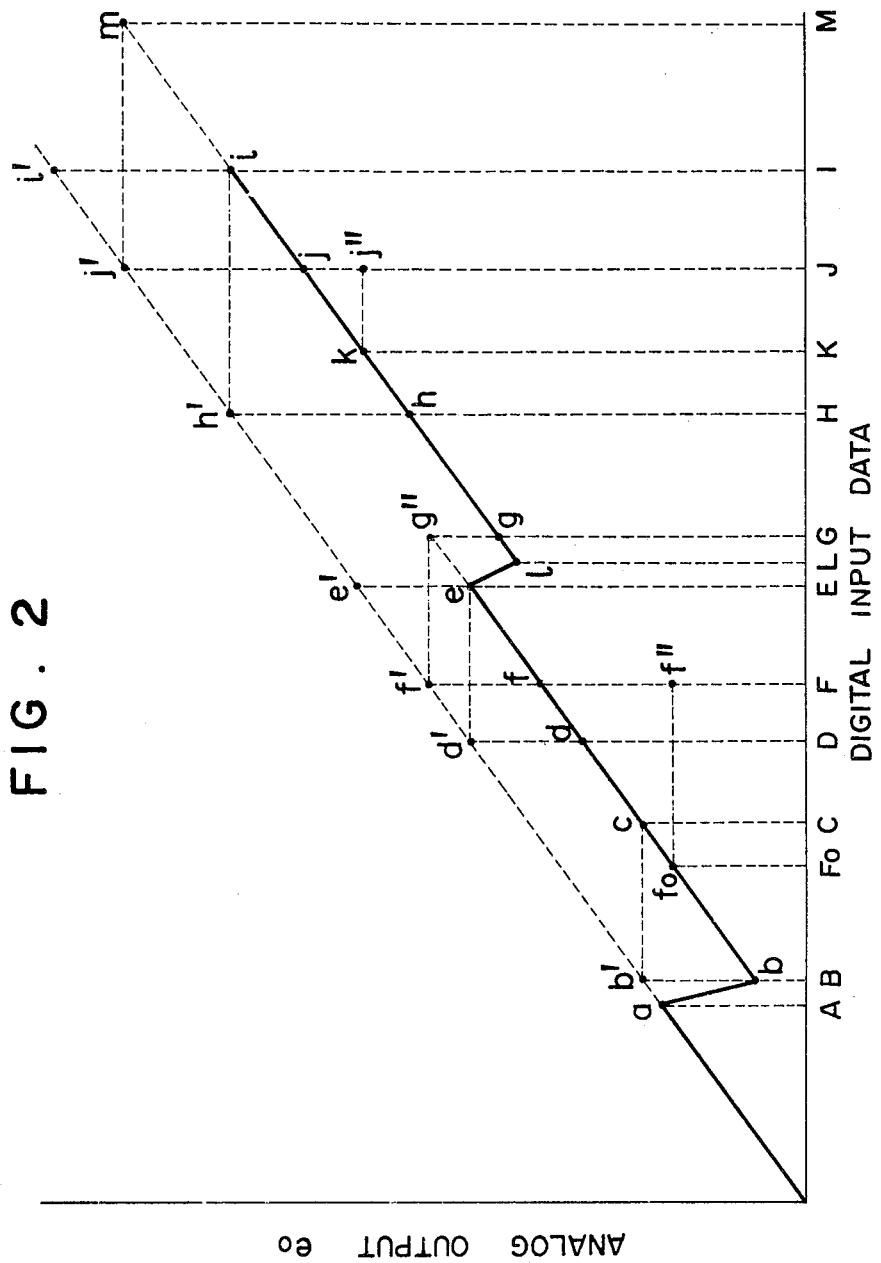
FIG. 2 is a diagrammatic illustration of the basic principle of other embodiments of the D/A conversion system according to the present invention.

The compensation D/A converter 12 shown in FIG. 1 is not required or eliminated in other embodiments of the D/A conversion system according to the present invention which will be described presently. The basic principle of such embodiments will be described with reference to FIG. 2. Suppose now that a D/A converter has an output characteristic as shown by the solid curve a-b-e-l-i in FIG. 2 in contrast to an ideal one shown by the chain line a-b'-e'-i. Referring to FIG. 2, the actual output $e_o$ of the D/A converter is given by the point b when its digital input data is, for example, B. On the other hand, the ideal output of this D/A converter is given by the point b'. Therefore, in order to obtain the same output for the input data B as that at the point b', the value of the input data B may be compensated to provide the value at a point c which corresponds to an input data C. The ideal output for the actual input data B can be obtained when the input data C is so selected that the output at this point c is equal to that at the point b'. This can be realized by adding the difference between the input data C and the input data B to the input data B. Entirely similarly, an input data D, for example, may be compensated so that it may have a value equal to that of an input data E.

Figure 3:
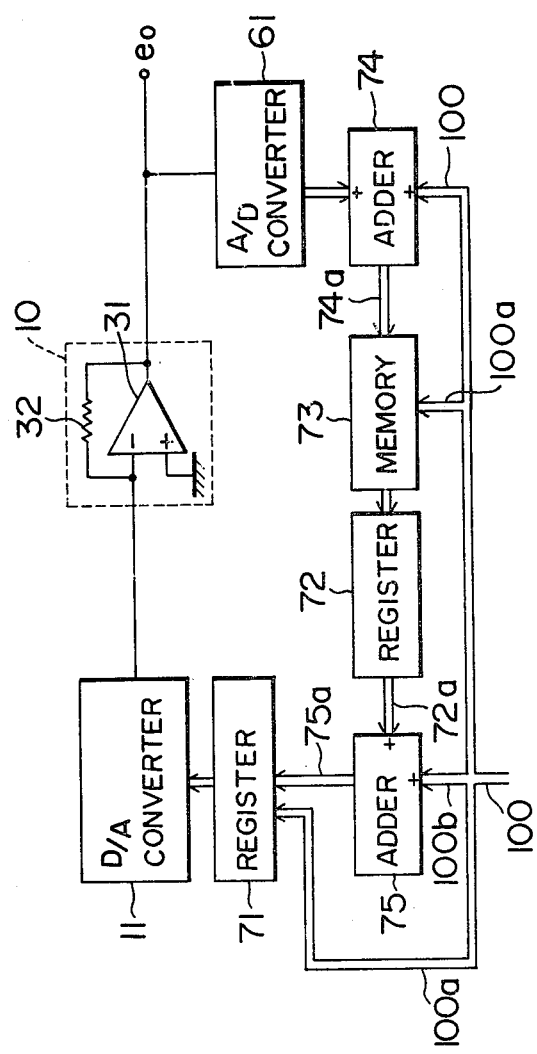
FIGS. 3, 4 and 7 are block diagrams showing respectively the circuit structures of these other embodiments of the present invention based on the basic principle illustrated in FIG. 2.

FIG. 3 shows another embodiment of the D/A conversion system according to the present invention which is constructed to realize the basic principle described with reference to FIG. 2. In FIG. 3, like reference numerals are used to denote like parts appearing in FIG. 1. The system shown in FIG. 3 is featured by the fact that an adder 75 is provided for adding a compensation data read out from a memory 73 to a lower 6-bit signal portion 100b of an input data signal 100. Such compensation data 74a are written in the memory 73 in a manner entirely similar to that described already with reference to FIG. 1. When an input data signal 100 is applied to the D/A conversion system after all the compensation data 74a have been written in the memory 73, the content 74a of the memory 73 at the address corresponding to the upper 4-bit signal portion 100a of the input data signal 100 is read out from the memory 73 to be set in a register 72. The output 72a of the register 72 is added in the adder 75 to the lower 6-bit signal portion 100b of the input data signal 100, and the result of addition 75a representing the compensated lower 6-bit signal portion 100b is applied to a register 71. The upper 4-bit signal portion 100a of the input data signal 100 is directly applied to the register 71. In this manner, the compensated input data providing the ideal output is set in the register 71, and this ideal output appears from a D/A converter 11. Suppose that the input data B in FIG. 2 is a binary number "0001000000". Suppose further that "0110" is the difference between the input data C providing the same output as that at the point b' and the input data B in FIG. 2. Then, the 5 bits given by adding the sign bit (which is, for example, 0 and 1 when the input data is positive and negative respectively) to the above difference "0110" is stored as the compensation data at the address "0001" in the memory 73. Consequently, in response to the application of the input data B, the compensation data "00110" is read out from the memory 73 to be added to the lower 6 bits "000000" of the input data B in the adder 75. As a consequence, the compensated lower 6-bits "000100" of the data input B appears from the adder 75 as its output 75a. Finally, an input data representing the combination of the upper 4 bits "0001" and lower 6 bits "000110" is set in the register 71. This input data coincides exactly with the input data C. Thus, the output at the point c is obtained, and it is readily seen that this output provides the same output as the ideal output at the point b' for the input data B.

In the manner above described, the nonlinearity of the output of the D/A converter 11 can be automatically compensated without requiring the compensation D/A converter 12 shown in FIG. 1.

However, the embodiment shown in FIG. 3, which is based on the basic principle shown in FIG. 2, is still insufficient in that the desired compensation cannot be applied to the end portions of some line segments of the characteristic curve, that is, the end portions of the line segments d-e and h-i in FIG. 2. When the manner of compensation shown in FIG. 2 is carried out in order to obtain an ideal output at, for example, a point f' for an input data F, this input data F is compensated to provide an input data G corresponding to a point g'' in FIG. 2. At this time, however, the actual output is that corresponding to a point g which differs from the ideal output point f'. Further, in the case of an input data J, the compensation provides an input data M corresponding to a point m which has the same output level as an ideal output point j'. In such a case, however, the proper compensated output for the input data J cannot be obtained since the compensated input data M exceeds the allowable maximum I of the input data. The break points of the characteristic curve shown in FIG. 2 appear when a change occurs in the upper 4 bits of the input data, and this corresponds to the case in which the result of addition 75a of the lower 6-bit signal portion 100b of the input data signal 100 and the compensation data output 74a of the memory 73 shows an overflow from the adder 75. Therefore, suitable compensation means must be provided to deal with such an overflow.

Such an overflow will be dealt with by a method which will be described below so that an input data can be compensated even in such a case. According to the basic principle of this method, a fixed constant-current source is separately provided so as to obtain an output at, for example, an ideal point f' for an input data F instead of the actual output at a point f in FIG. 2. This constant-current source may have a capacity to supply a current of amount corresponding to the difference between the points f and f'. However, when, for example, the input data is J, another amount of current corresponding to the difference between points j and j' is also required. This means that a plurality of different current sources are required for the compensation of input data in the individual input data regions. Another embodiment of the present invention is constructed so that a single current source can supply these currents. More precisely, a single current source is employed which is capable of supplying a current large enough for compensating the maximum error between an actual output point and an ideal output point.

Suppose now that an input data F is applied, and the compensating current source is capable of supplying a current corresponding to the difference between points f' and f''. Then, the input data F may be compensated to provide an input data $F_o$ so that the D/A converter 11 can provide the same output as that at the point f'', that is, the output at a point $f_o$. Thus, when, for example, the input data F is compensated to provide the input data G according to the manner of compensation described with reference to FIG. 3, and the result of addition of the lower 6 bits of the input data F to the compensation data output 74a of the memory 73 shows an overflow, the current value corresponding to the compensation current (f'-f'') may be subtracted from that corresponding to the compensated input data G, and an input data corresponding to this value may be employed as a newly compensated input data which is $F_o$ in this case.

The above basic principle will be quantitatively expressed below. Suppose that X designates generally an input data, and Y designates an output data corresponding to an actual output αY of the D/A converter in this case.

Then, within the range b-e in FIG. 2, Y is expressed as $$Y = X - \Delta X \qquad (1)$$

where $\Delta X$ is the quantity to be used for the compensation. Hereinafter, compensation in the case of $\Delta X > 0$ will be called positive compensation, and compensation in the case of $\Delta X < 0$ will be called negative compensation. Thus, when the input data X lies within the range B-D, a compensated data X' given by $$X' = X + \Delta X \qquad (2)$$

according to the manner of compensation described with reference to FIG. 3 may be applied to obtain a compensated output Y' given by $$Y' = X \qquad (3)$$

When the input data X lies within the range D-E, it has been impossible to attain the desired compensation since $(X + \Delta X)$ representing the result of addition exceeds the input data E. According to the embodiment described presently, therefore, a single constant-current source is employed to supply a current corresponding to an input data $X_o$ which is added to the output of the D/A converter so as to provide a compensated input data X". When this input data X" is selected to lie within the range B-E of the input data X, an output Y" given by the following equation is obtained:

$$Y'' = X'' - \Delta X + X_o \qquad (4)$$

In order that this value is equal to X, the input data X may be compensated to be X" so as to satisfy the following equation:

$$X = X'' - \Delta X + X_o \qquad (5)$$

$$\text{or } X'' = X - X_o + \Delta X \qquad (6)$$

Suppose that an upper $k_1$-bit portion of each input data includes an error, while a lower $k_2$-bit portion of the input data does not include an error, and this error has a decimal value given by lower $k_3$ bits $(k_3 < k_2)$. Then, $X_o$ must be smaller than $2^{k_2}$ and larger than $(2^{k_3} - 1)$ in order that X" is to lie within the range B-E of input data. For example, $X_o$ must be between 64 and 15 when $k_1 = 4$, $k_2 = 6$ and $k_3 = 4$.

Figure 4:
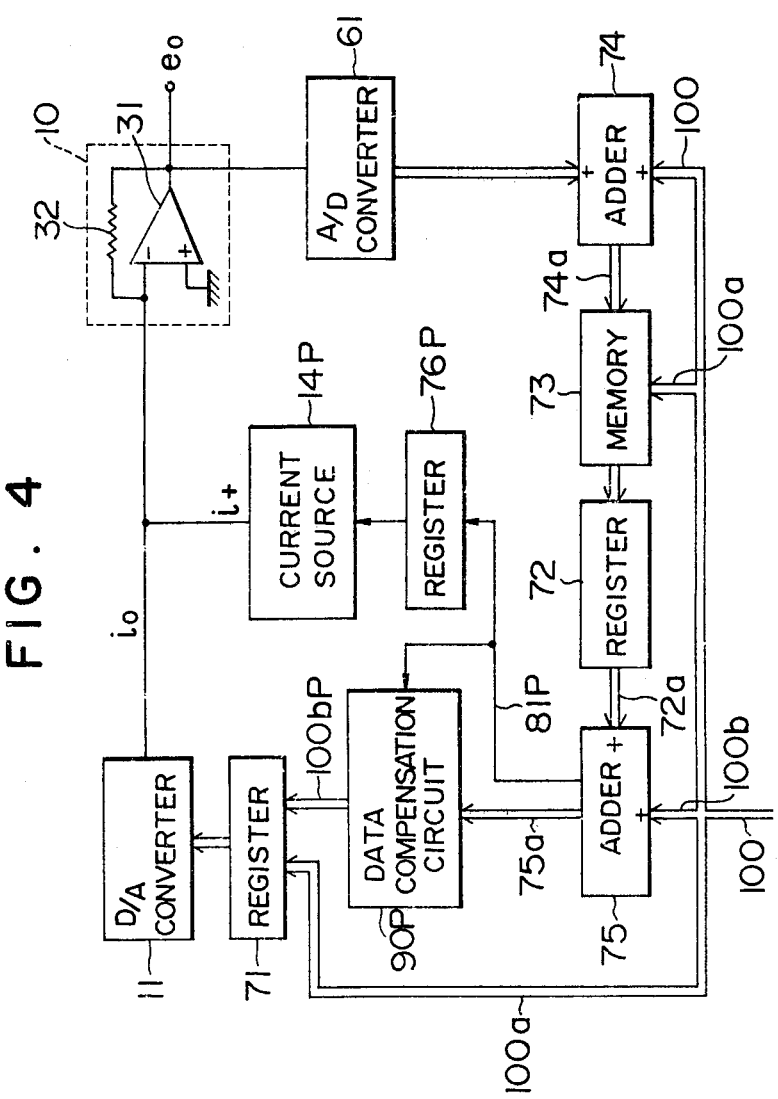

FIG. 4 shows the structure of this specific embodiment of the D/A conversion system according to the present invention. In FIG. 4, the same reference numerals are used to denote the same parts appearing in FIG. 3. Referring to FIG. 4, the system differs from that shown in FIG. 3 in that it comprises a 1-bit register 76P for storing an overflow signal 81P applied from the adder 75, a current source for positive compensation 14P for supplying a predetermined compensation current $i_+$ when the overflow signal 81P is in its "1" level, and a data compensation circuit 90P for compensating the output 75a of the adder 75. The other elements are the same as those in FIG. 3.

The input 75a applied from the adder 75 to the data compensation circuit 90P appears intact as an output 100bP from this circuit 90P when the overflow signal 81P is in its "0" level. The operation of the entire system in this case is the same as that described with reference to FIG. 3. When, on the other hand, the overflow signal 81P of "1" level appears from the adder 75, the data compensation circuit 90P carries out compensation according to the equation (6). The compensation of the input data according to the equation (6) is directed only to the output 75a of the adder 75 since it is only necessary to apply the compensation to the lower 6 bits of the input data.

Figure 5:
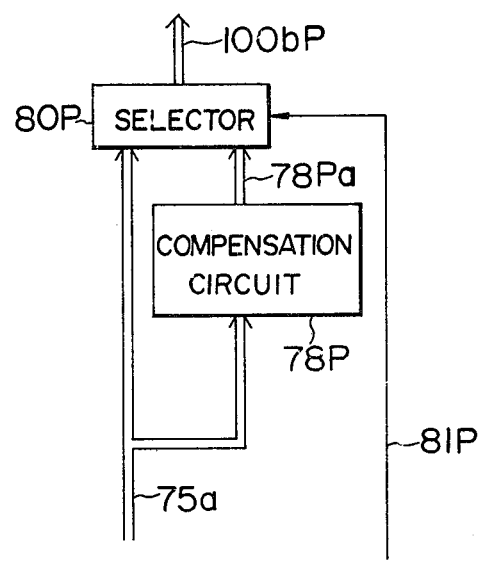
FIGS. 5 and 6 are circuit diagrams showing respectively the practical structures of part of the system shown in FIG. 4.

This data compensation circuit may have a practical structure as shown in FIG. 5. Referring to FIG. 5, the output 75a of the adder 75 appears intact as an output 100bP of a selector 80P to be set in the register 71 in a manner entirely similar to that described with reference to FIG. 3, when the overflow signal 81P is in its "0" level. When, on the other hand, the overflow signal 81P of "1" level appears from the adder 75, a positive data compensation circuit 78P provides an output 78Pa representing the result of compensation of the output 75a of the adder 75, and such an output 78Pa is selected by the selector 80 and applied as the output 100bP to the register 71 to be set therein.

The output 75a of the adder 75 in the system shown in FIG. 4 will now be discussed with reference to the case in which an overflow occurs in the adder 75. Suppose that X (1, 4) is the decimal representation of the binary input data 100 of 10 bits in which upper 4 bits remain unchanged and lower 6 bits are all "0's". Suppose further that X (5, 10) is the decimal representation of the binary input data 100 in which upper 4 bits are all "0's" and lower 6 bits remain unchanged to represent the corresponding decimal number. Then, the input data X is given by $$X = X(1, 4) + X(5, 10) \qquad (7)$$

In this case, the compensated input data X" is to be expressed as $$X'' = X(1, 4) + X(5, 10) - X_o + \Delta X \qquad (8)$$

according to the equation (6). Thus, when $X_0$ and $\Delta X$ are less than and including 5 bits, the decimal number X" (5, 10) represented by the lower 6 bits of the compensated input data X" is given by $$X''(5, 10) = X(5, 10) - X_o + \Delta X \qquad (9)$$

On the other hand, this X (5, 10) and the compensation data 72a $(=\Delta X)$ are added in the adder 75. Therefore, when an overflow occurs in the result of addition in the adder 75, the output 75a of the adder 75 is given by $$X_{P'}(5, 10) = X(5, 10) + \Delta X - 64 \qquad (10)$$

where $X_{P'}$ (5, 10) represents the output 75a of the adder 75 at that time. Therefore, the positive data compensation circuit 78P must make such a manner of data compensation that the value of $X_{P'}$ (5, 10) given by the equation (10) coincides with the value of X" (5, 10) given by the equation (9). For this purpose, the positive data compensation circuit 78P is constructed so that $$\Delta P = 64 - X_o \qquad (11)$$

representing the difference between the equations (9) and (10) is added to the value of $X_{P'}$ (5, 10) representing the output 75a of the adder 75 at that time. As a practical numerical value, $\Delta P = 48$ when $X_o = 16$.

In the manner above described, the output of the D/A converter having the characteristic shown in FIG. 2 can be automatically accurately compensated.

Figure 6:
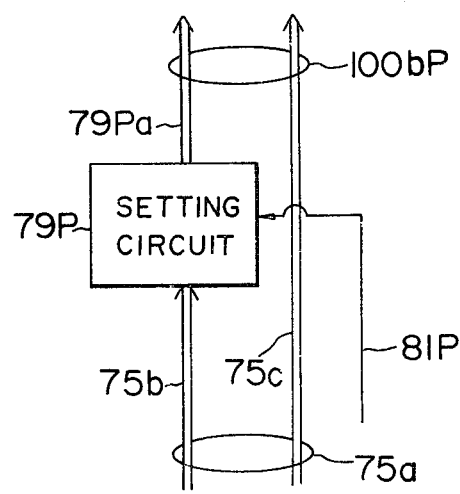

In the embodiment described with reference to FIG. 4, it may be supposed that the compensation data is of 4 bits. In such a case, an overflow occurs in the result of addition in the adder 75 when both the 5th bit and the 6th bit counting from the most significant bit of the input data are "1's", and the addition of the lower 4 bits of the input data and the compensation data of 4 bits results in the appearance of a carry output. Therefore, when the overflow occurs, both the 5th bit and the 6th bit of the output 75a of the adder 75 are "0's". On the other hand, $\Delta P = 48$ when $X_o = 16$ as above described. This $\Delta P$ is expressed as "110000" according to the binary notation, and the addition of this $\Delta P$ to the aforementioned output 75a of the adder 75 results that the 5th and 6th bits of the input data, which have been originally "1's" and rendered to be "0's" in the output 75a of the adder 75 due to the overflow, are turned into "1's" again. In such a case, therefore, the positive data compensation circuit 90P shown in FIG. 4 can be simplified into a form as shown in FIG. 6. Referring to FIG. 6, the output 75a of the adder 75 is divided into a signal portion 75b representing the 5th and 6th bit positions of the original input data and a signal portion 75c representing the lower 4 bits. The former signal portion 75b is "00" when the overflow signal 81P takes its "1" level. This former signal portion 75b of "00" is converted into a signal of "11" in a positive setting circuit 79P to appear as an output 79Pa of the circuit 79P. When, on the other hand, the overflow signal 81P is in its "0" level, the signal portion 75b appears intact as the output 79Pa of the setting circuit 79P. The latter signal portion 75c representing the result of addition of the lower 4 bits in the adder 75 is not applied to the setting circuit 79P and remains thus in the original form. The combination of the output 79Pa of the setting circuit 79P and the signal portion 75c of the adder output 75a is applied as the compensated data 100bP of lower 6 bits to the register 71 shown in FIG. 4.

It will thus be seen that the positive compensation of data can be attained when a current source having a capacity of $X_o = 16$ is employed as the positive compensation current source 14P in FIG. 4. However, $\Delta P = 0$ when $X_o = 64$ as will be readily seen from the equation (11). It is apparent that, in such a case, no data compensation is required, and the data compensation circuit 90P is unnecessary.

The above description has clarified that accurate data compensation can be carried out even when an overflow occurs as a result of compensation of an input data.

In the embodiment shown in FIG. 4, the positive compensation current source 14P has been used for the sole purpose of dealing with the instance of appearance of an overflow from the 6-bit adder 75. However, this current source can be constructed to be used for other purposes, and such a construction can simplify the structure of the D/A conversion system.

Figure 7:
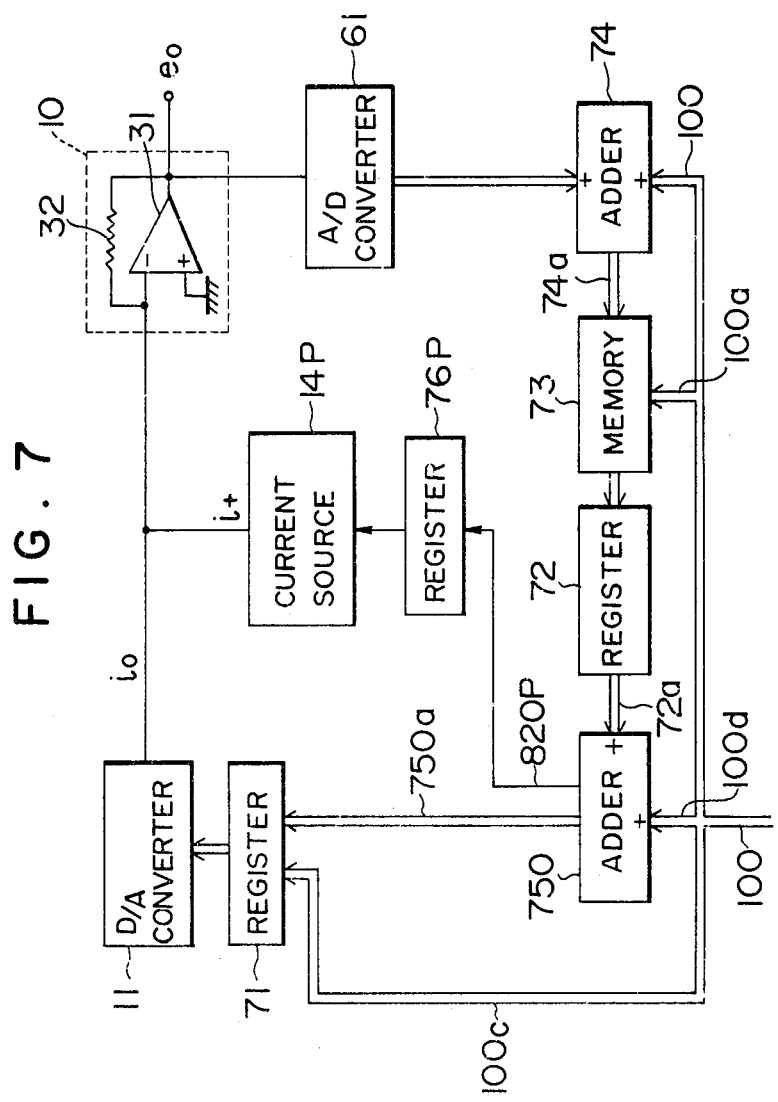

Such a modification will be described with reference to FIG. 7. Referring to FIG. 7, a 4-bit adder 750 adds a compensation data 72a of 4 bits supplied from the memory 73 and a signal portion 100d representing the lower 4 bits of an input data signal 100, and when an overflow occurs, an overflow signal 820P similar to the overflow signal 81P shown in FIG. 4 appears from the adder 750. The output 750a of the adder 750 is applied to the register 71 together with a signal portion 100c representing the upper 6 bits of the input data signal 100. The other elements are entirely the same as those shown in FIG. 4. In the embodiment shown in FIG. 7, the capacity of the positive compensation current source 14P is also selected to be $X_o = 16$. When no overflow occurs as a result of addition of the compensation data 72a of 4 bits and the lower 4-bit signal portion 100d of the input data signal 100 in the adder 750, the output 750a of the adder 750 is set intact in the lower 4 bit positions of the register 71. When an overflow occurs as a result of addition in the adder 750, the output 750a of the adder 750 appearing at the time of occurrence of the overflow is set in the lower 4 bit positions of the register 71, and, at the same time, the register 76P is set by the overflow signal 820P, so that the current source 14P can be actuated in concurrent relation with the operation of the D/A converter 11. As above described, this current source 14 has the capacity of $X_o = 16$ corresponding to the number of bits handled by the adder 750.

It will be seen from the above description that the output of the D/A converter 11 can be simply compensated by the provision of the adder 750 which adds the predetermined number of bits of the compensation data and the same number of lower bits of the input data, and also by the provision of the compensation current source 14P having the capacity corresponding to the predetermined number of bits.

In general, the adder 750 may be a $k_3$-bit adder, and the positive compensation current source 14P may have a capacity of $2^{k_3}$ when the compensation data is of $k_3$ bits.

In the manner above described, the output of the D/A converter 11 having the characteristic shown in FIG. 2 can be satisfactorily compensated. It is to be added that any compensation need not be applied to the ranges A-B and E-L in FIG. 2 since a change corresponding to one unit quantity occurs only in these ranges.

Figure 8:
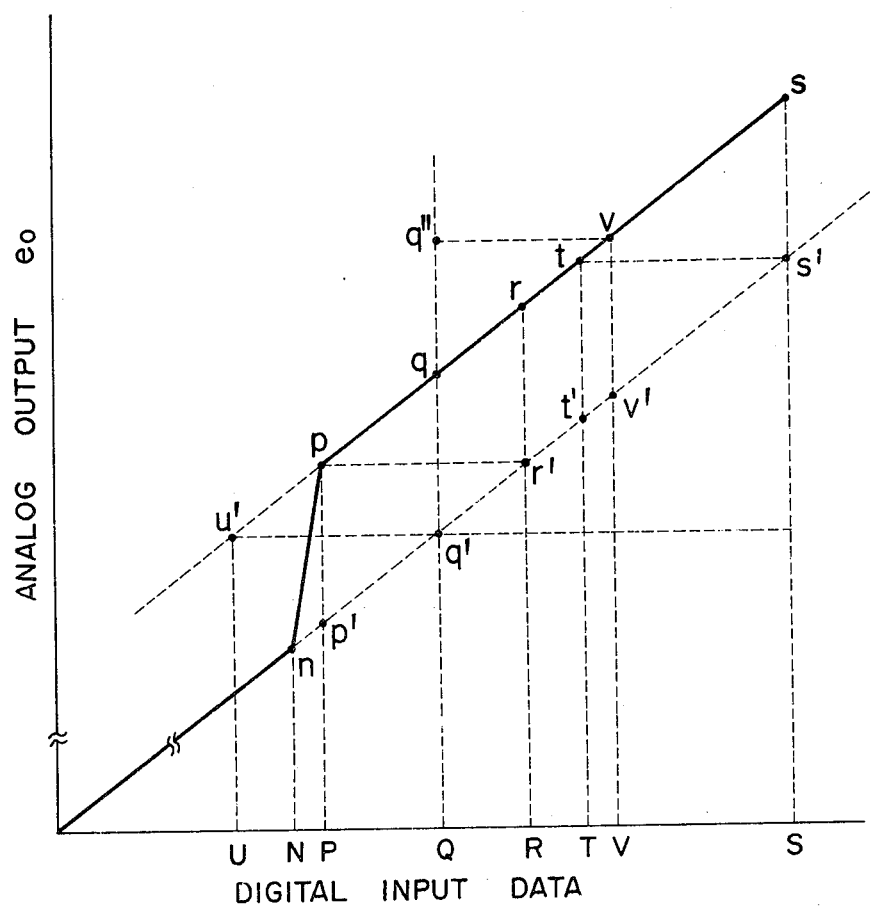
FIG. 8 is a diagrammatic illustration of the basic principle of still other embodiments of the D/A conversion system according to the present invention.

Consider now the case in which the actual output characteristic of a D/A converter is as shown by the solid curve n-p-s in FIG. 8, and thus, the analog output is greater than that of an ideal characteristic shown by the chain line. In such a case, the circuit shown in FIG. 1 is, of course, useful for compensation. In the case of FIG. 8, the compensation data of negative value is required, and the compensation D/A converter 12 in FIG. 1 may be constructed to supply a negative current.

When the input data lies within the range R-S in FIG. 8, the circuit shown in FIG. 3 may be used for attaining compensation in a manner entirely similar to that described with reference to FIG. 2. When, for example, an input data S is applied, a point t is selected instead of the actual output point s since, at this point t, the output is the same as that at the ideal output point s'. For this purpose, the input data S may be compensated to provide an input data T. However, in the case of, for example, an input data Q which lies within the range P-R, the manner of compensation according to the circuit shown in FIG. 3 provides a compensated input data U, and no output is obtained at a point u' corresponding to this input data U. In this case too, therefore, suitable compensation means like those employed in the system shown in FIG. 4 are necessary. The above difficulty can be easily overcome by employing means like those employed in the systems shown in FIGS. 4 to 7. Such means will now be briefly described.

Figure 9:
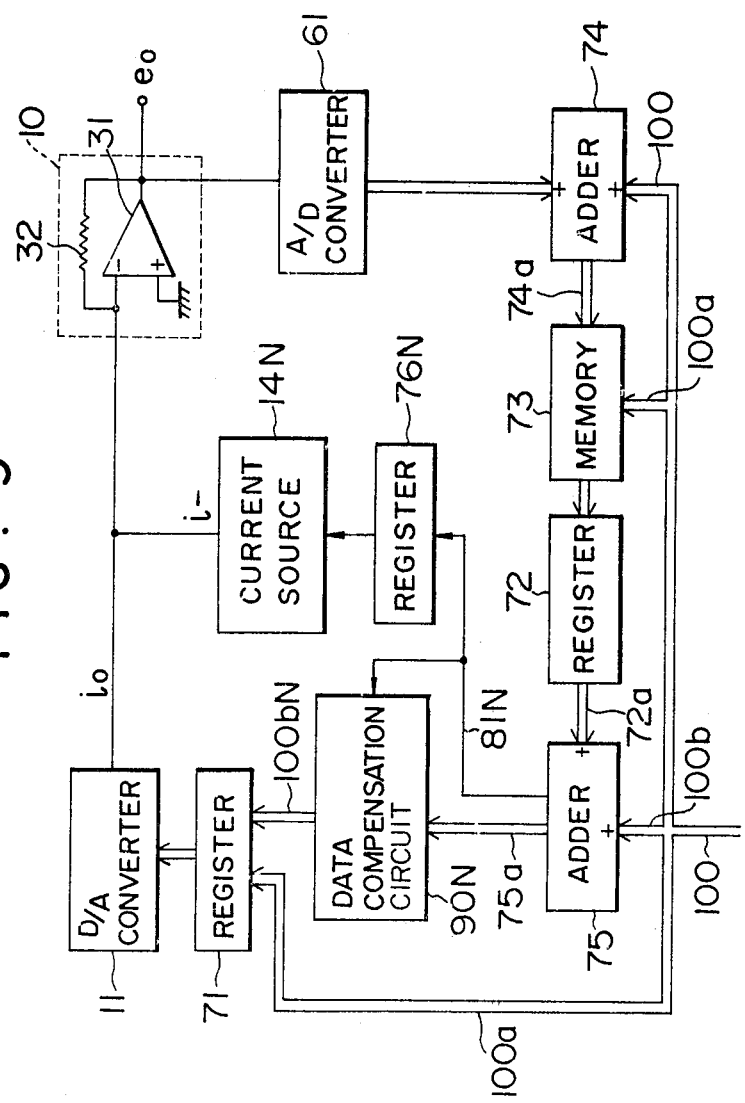
FIGS. 9 and 12 are block diagrams showing respectively the circuit structures of the still other embodiments of the present invention based on the basic principle illustrated in FIG. 8.

The compensation for the input data Q provides the compensated input data U in FIG. 8 when the result of addition in the adder 75 in FIG. 3 provides a negative value. Therefore, proper compensation can be attained by employing an arrangement similar to that employed in the system shown in FIG. 4 which is an improvement of the structure shown in FIG. 3. Referring to FIG. 9 showing another embodiment, or a modification of, the embodiment shown in FIG. 4, a sign signal 81N representing the sign of the result of addition in the adder 75 (which signal takes its "1" level when the result of addition is negative) is applied to a register 76N to be set therein. A current source 14N for negative compensation supplies a negative compensation current i only when a "1" is registered in the register 76N. A negative data compensation circuit 90N compensates the output 75a of the adder 75 depending on whether the sign signal 81N is in its "1" or "0" level and applies an output 100bN to the register 71.

The operation of this negative compensation circuit 90N will now be described. The aforementioned equations (1) to (9) hold regardless of the fact that the compensation data $\Delta X$ supplied from the memory 73 is negative and the compensation current i supplied from the negative compensation current source 14N is also negative, when the sign is properly considered. Suppose that $X_N'$ (5, 10) is the output 75a of the adder 75 when the result of addition in the adder 75 is negative. Then, this $X_N'$ (5, 10) is given by $$X_N'(5, 10) = X(5, 10) + \Delta X + 64 \qquad (10')$$

when the sign bit is excepted. Therefore, in order that this $X_N'$ (5, 10) coincides with the target value $X''$ (5, 10) given by the equation (9), $$\Delta_N = -64 - X_o \qquad (11')$$

representing the difference between the equations (9) and (10') may be added to the value of $X_N'$ (5, 10) representing the output 75a of the adder 75 at that time. It is to be noted that $\Delta_N$ has a negative value.

Figure 10:
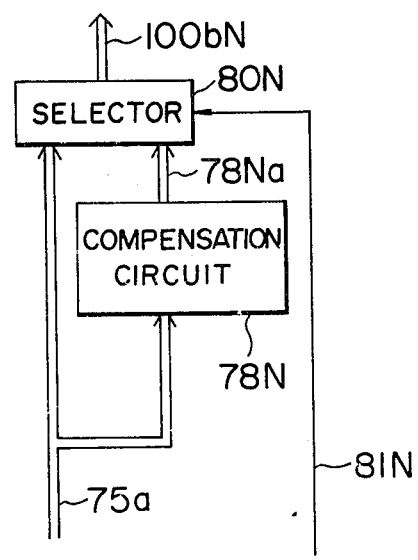
FIGS. 10 and 11 are circuit diagrams showing respectively the practical structures of part of the system shown in FIG. 9.

The negative data compensation circuit 90N may have a practical structure as shown in FIG. 10. A negative compensation circuit 78N acts to add the value of $\Delta_N$ given by the equation (11') to the input 75a applied from the adder 75 and applies its output 78Na to a selector 80N. Depending on whether the sign signal 81N is in its "1" or "0" level, the output 78Na of the compensation circuit 78N or the output 75a of the adder 75 appears selectively as the output 100bN of the selector 80N. As a practical numerical value, $\Delta_N = -48$ when $X_o = 16$.

In the manner above described, accurate compensation can be automatically carried out for the output of the D/A converter 11 having the characteristic shown in FIG. 8.

Figure 11:
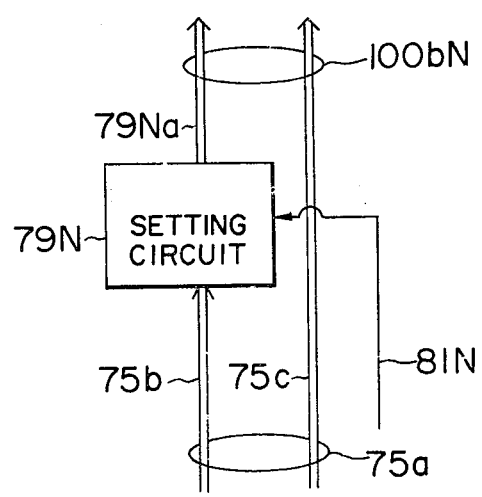

In the embodiment described with reference to FIG. 9, it may be supposed that the compensation data is of 4 bits. In such a case, a negative output appears from the adder 75 when both the 5th bit and the 6th bit counting from the most significant bit of the input data are "0's", and the addition of the lower 4 bits of the input data and the compensation data of 4 bits does not result in the appearance of a carry output. Therefore, in this case, both the 5th bit and the 6th bit of the output 75a of the adder 75 are "1's". On the other hand, $\Delta_N = -48$ when $X_o = 16$ as above described. This $\Delta_N$ is expressed as "001110" according to the binary notation except for the sign bit, and the addition of this $\Delta_N$ to the aforementioned output 75a of the adder 75 results that the 5th and 6th bits of the input data, which have been originally "0's" and rendered to be "1's" in the output 75a of the adder 75, are turned into "0's" again. In such a case, therefore, the negative data compensation circuit 90N in FIG. 9 can be simplified into a form as shown in FIG. 11. Referring to FIG. 11, the output 75a of the adder 75 is divided into a signal portion 75b representing the 5th and 6th bit positions of the original input data and a signal portion 75c representing the lower 4 bits. The former signal portion 75b is represented by "11" when the sign signal 81N takes its "1" level. Such a signal portion 75b is converted into a signal of "00" in a negative setting circuit 79N to appear as an output 79Na of the circuit 79N. When, on the other hand, the sign signal 81N is in its "0" level, the signal portion 75b appears intact as the output 79Na of the setting circuit 79N. The latter signal portion 75c representing the result of addition of the lower 4 bits is not applied to the setting circuit 79N and remains thus in the original form. The combination of the output 79Na of the setting circuit 79N and the signal portion 75c of the adder output 75a is applied as the compensated input data 100bN of lower 6 bits to the register 71 shown in FIG. 9.

The negative data compensation circuit 90N is unnecessary as referred to the instance of the positive compensation when the negative compensation current source 14N is constructed to have the capacity of $X_o = -64$.

The above description has clarified that accurate data compensation can be carried out even when a negative output appears from the adder 75 as a result of compensation of an input data.

In the embodiment shown in FIG. 9, the negative compensation current source 14N has been used for the sole purpose of dealing with the instance of appearance of a negative output from the 6-bit adder 75. However, this current source 14N can be constructed to be used for other purposes, and such a construction can simplify the structure of the D/A conversion system.

Figure 12:
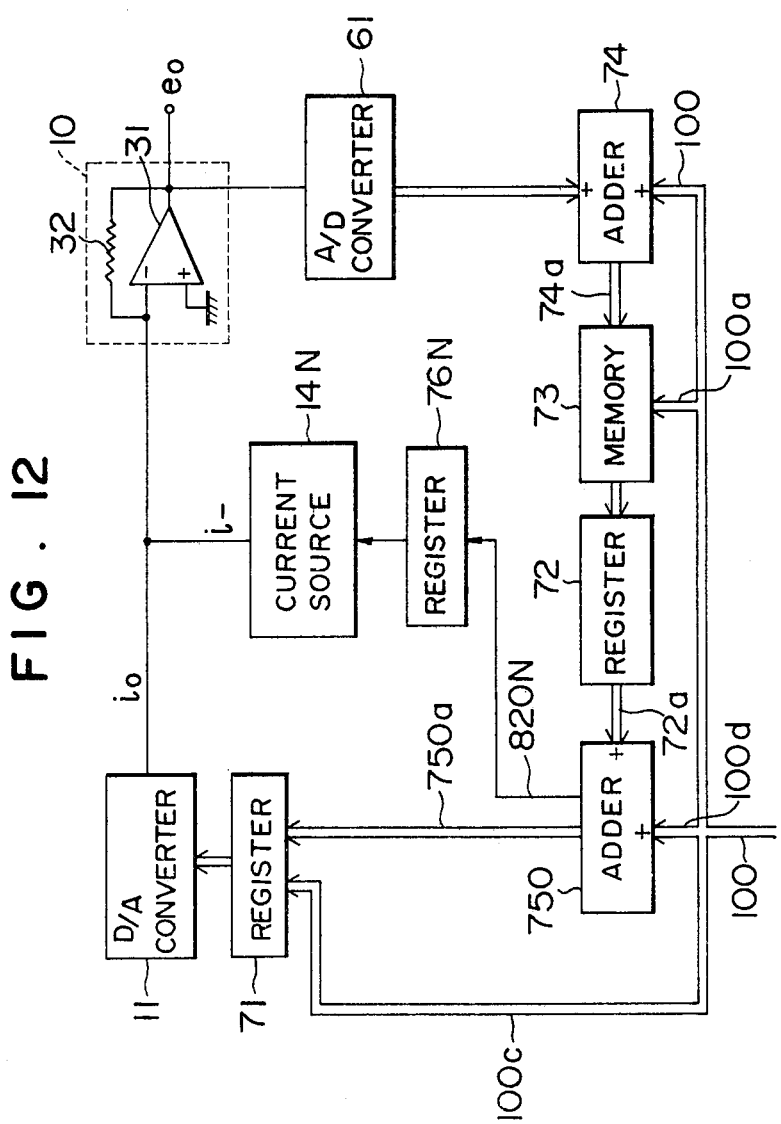

Such a modification will be described with reference to FIG. 12. Referring to FIG. 12, a 4-bit adder 750 adds a compensation data 72a of 4 bits supplied from the memory 73 and a signal portion 100d representing the lower 4 bits of an input data signal 100, and a sign signal 820N similar to the sign signal 81N shown in FIG. 9 appears from the adder 750 to indicate the sign of the result of addition. The output 750a of the adder 750 is applied to the register 71 together with a signal portion 100c representing the upper 6 bits of the input data signal 100. The other elements are entirely the same as those shown in FIG. 9. In the embodiment shown in FIG. 12, the capacity of the negative compensation current source 14N is selected to be $X_o = -16$. When no negative output appears from the adder 750 as a result of addition of the compensation data 72a of 4 bits and the lower 4-bit signal portion 100d of the input data signal 100 in the adder 750, the output 750a of the adder 750 is set intact in the lower 4 bit positions of the register 71. When a negative output appears from the adder 750 as a result of addition, this output 750a of the adder 750 is set in the lower 4 bit positions of the register 71, and, at the same time, the register 76N is set by the sign signal 820N, so that the current source 14N can be actuated in concurrent relation with the operation of the D/A converter 11. As above described, this current source 14N has the capacity of $X_o = -16$ corresponding to the number of bits handled by the adder 750.

It will be seen from the above description that the output of the D/A converter 11 can be simply compensated by the provision of the adder 750 which adds the predetermined number of bits of the compensation data and the same number of lower bits of the input data, and also by the provision of the compensation current source 14N having the capacity corresponding to the predetermined number of bits.

In general, the adder 750 may be a $k_3$-bit adder, and the negative compensation current source 14N may have a capacity of $2^{k_3}$ when the compensation data is of $k_3$ bits, as described already in the case of the positive compensation.

The embodiments described with reference to FIGS. 9 and 12 have been arranged so that a negative compensation data is applied to the adder 75, 750 for the compensation of an input data. Therefore, the sign bit plus the compensation data of 4 bits should be the output 72a of the memory 73.

It will be understood from the foregoing description that any desired positive compensation can be carried out by the embodiment shown in FIG. 4 or 7, and any desired negative compensation can be carried out by the embodiment shown in FIG. 9 or 12. Therefore, these four embodiments may be suitably combined when both the positive compensation and the negative compensation are required for the output of a D/A converter. In this case, a negative compensation current source is used for the negative compensation, and a positive compensation current source is used for the negative compensation. However, these two current sources may be suitably combined in a D/A conversion system so that the structure of the system can be more simplified. Such a modification will now be described.

The operation of the embodiments adapted for the negative compensation is entirely symmetrical to that of the embodiments adapted for the positive compensation. However, the output characteristic of a D/A converter for which negative compensation is required can be converted into that for which positive compensation is required. Suppose, for example, that a D/A converter has an output characteristic as shown by the solid curve a-b-e-p-s in FIG. 13. Then, the line segment p-s corresponding to the input data range P-S can be shifted to the position of a line segment p''-s'' when a negative compensation current is supplied continuously in this range. Therefore, positive compensation may be made on this new characteristic curve.

Figure 13:
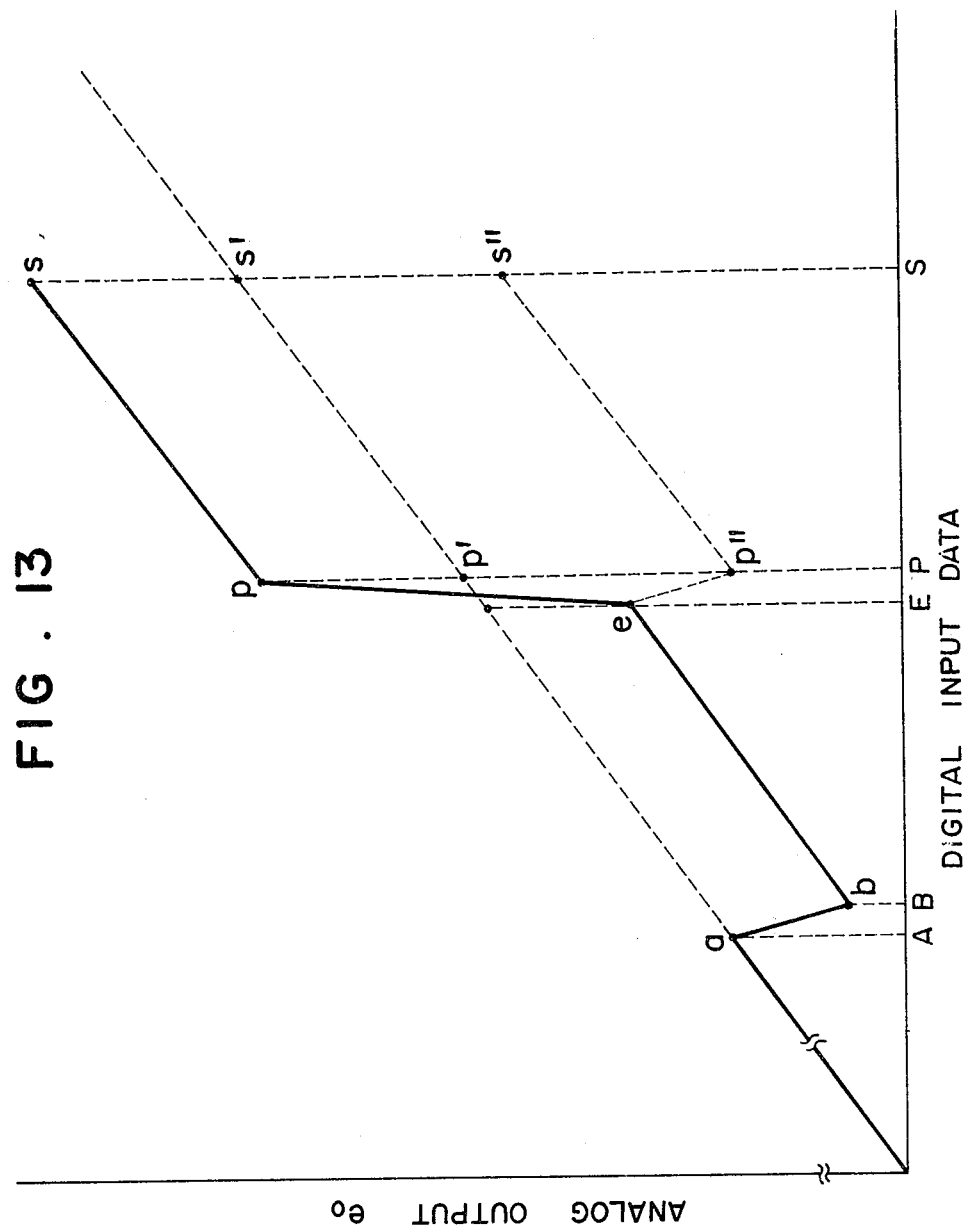
FIG. 13 is a diagrammatic illustration of the basic principle of yet another embodiment of the D/A conversion system according to the present invention.
Figure 14:
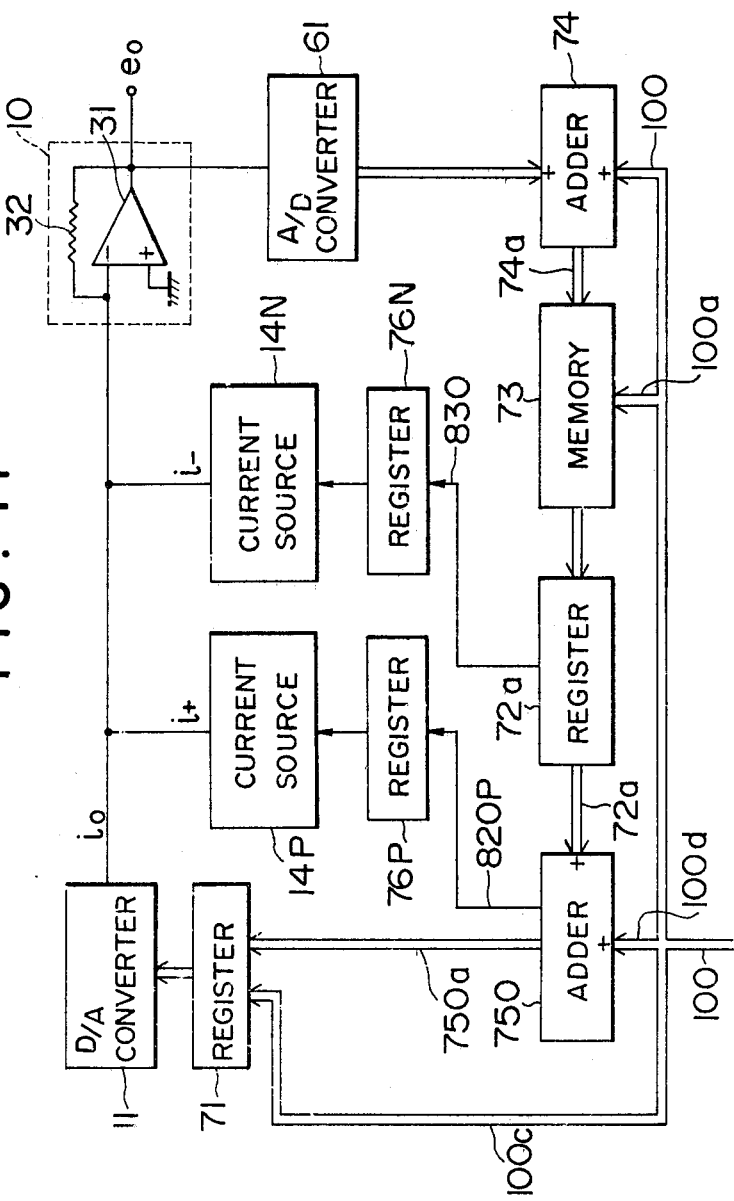
FIG. 14 is a block diagram showing the circuit structure of the yet another embodiment of the present invention based on the basic principle illustrated in FIG. 13.

A modification suitable for this purpose will be described with reference to FIG. 14. Referring to FIG. 14, a sign bit signal 830 representing the sign bit added to a compensation data 72a read out from the memory 73 and appearing from the register 72 is applied to and set in the register 76N to actuate the negative compensation current source 14N. When an input data lies within the range P-S in FIG. 13, the compensation data 72a is negative, and the sign bit is a "1". This negative compensation current source 14N acts to alter the actual output characteristic range p-s into the new output characteristic range p''-s''. As a consequence of such an alteration of the output characteristic of the D/A converter 11 by means of the negative compensation current source 14N, the apparent output range p''-s'' of the D/A converter 11 requires now positive compensation.

Consequently, the circuit including the adder 750, register 76P and positive compensation current source 14P illustrated already in FIG. 7 can be used, for example, for carrying out positive compensation so as to provide an ideal output characteristic range p'-s' on the basis of the range p''-p''. In this case, the data part of a compensation data, that is, the part except for the sign bit, stored in the memory 73 may be considered to be a positive value so that it may be directly used for compensation. For this purpose, the sign bit may be reset to "0" and such a compensation data may be supplied to the adder 750, or no sign bit may be supplied. When, for example, the compensation quantity is generally expressed as $-\Delta X$, the sign bit "1" $+(16-\Delta X)$ is stored in the memory 73 so that the compensation data can be used to compensate a maximum of 4 bits. On the other hand, when the capacity of the negative compensation current source 14N is generally expressed as $-X_o$, the quantity of positive compensation is $X_o - \Delta X$ for the characteristic range p''-s'' in FIG. 13. It is therefore apparent that, when $X_o = 16$, the data part $(16-\Delta X)$ of the compensation data stored in the memory 73 can be satisfactorily used for the positive compensation of an input data lying within the range p-s corresponding to the characteristic range p''-s''. In general, the negative compensation current source 14N may have a capacity of $2^{k_3}$ when the compensation data of $k_3$ bits is used for the negative compensation.

It will thus be seen that the desired negative compensation can be carried out by the arrangement shown in FIG. 14. More preferably, the circuit shown in FIG. 14 can be directly used for the positive compensation. It is therefore apparent that the structure shown in FIG. 14 is directly application to a D/A converter producing an output for which both the positive compensation and the negative compensation are required as shown in FIG. 13.

It will be apparent to those skilled in the art that an output characteristic range to be subjected to positive compensation may be converted into that to be subjected to negative compensation and such a characteristic range may be processed by means of negative compensation in entirely contrary to the case in which an output characteristic range to be subjected to negative compensation is converted into that to be subjected to positive compensation. In such a case, the negative and positive compensation current sources 14N and 14P in FIG. 14 may be replaced by the positive and negative compensation current sources 14P and 14N respectively so as to supply the positive compensation current from the current source 14P when the compensation data is positive, and the compensation data with the sign bit set at "1" may be supplied to the adder 750.

It will be understood from the foregoing detailed description of various embodiments of the present invention that the present invention is featured by the fact that some upper bits of input data are utilized as an address signal, and a memory storing a compensation quantity at each of such addresses is provided so as to obtain necessary compensation data in concurrent relation with the application of the input data. The present invention is thus advantageous in that combination of low-accuracy D/A converters can provide a high-accuracy D/A conversion system. In the aforementioned embodiments of the present invention, binary compensation data of further lower bits may be prepared besides the lower 4 bits used for the compensation purpose, and a corresponding D/A converter may be additionally provided so as to reduce the linearity error to less than ½ LSB.

In the actual D/A conversion process, the A/D converter 61, C/V converter 10 and digital adder 74 do not participate in the D/A conversion once the necessary compensation data have been stored in the memory 73. Therefore, these elements may be provided for the exclusive purpose above described and may be disconnected from the system during the process of D/A conversion of input data carried out by the remaining elements.

Although the aforementioned embodiments of the present invention have specifically referred to the automatic writing of compensation data in the memory by the A/D converter and adder, the compensation data may be automatically written in the memory by any other suitable means or may be manually written in the memory.

It is apparent that the present invention is in no way limited to the aforementioned specific embodiments, and various changes and modifications may be made therein without departing from the scope of appended claims.

What is claimed is:

1. A D/A conversion system comprising:
input means for applying a digital signal composed of n upper bits and m lower bits as an input to the system;
a D/A converter for converting the digital input signal applied from said input means into an analog signal;
output means for receiving the analog signal applied from said D/A converter to provide an analog output signal of the system;
memory means for storing a compensation data, used for the compensation of non-linearities inherent in the D/A converter by compensation of the analog signal appearing from said output means, at an address corresponding to the upper bit portion of the digital input signal;
adder means for adding the compensation data, read out from said memory means at the address corresponding to the upper bit portion of the digital input signal applied from said input means and the lower bit portion of the digital input signal; and
signal applying means for applying the output signal of said adder means representing the result of addition to said D/A converter together with the upper bit portion of the digital input signal, and further comprising
an A/D converter for converting the analog signal appearing from said output means into a digital signal when said adder means is rendered non-operative, and arithmetic means for computing the difference between the digital input signal applied from said input means and the digital signal appearing from said A/D converter and applying the difference signal to the address of said memory means specified by the upper bit portion of the digital input signal.

2. A D/A conversion system as claimed in claim 1, wherein said output means includes conversion means for converting an analog current signal output of said D/A converter into a voltage signal.

3. A D/A conversion system as claimed in claim 1, further comprising a second D/A converter coupled to said memory means for providing an analog signal output corresponding to the compensation data read out from said memory means at the address corresponding to the digital input signal applied from said input means, and summing means for summing the output of said second D/A converter and the output of said D/A converter to apply the sum to said output means.

4. A D/A conversion system as claimed in claim 3, wherein the second D/A converter and the summing means are rendered non-operative in a first system operation state in which the difference signals from the arithmetic means are being entered into the memory means, and the A/D converter and the arithmetic means are rendered non-operative in a second system operation state in which normal D/A conversion takes place with the compensated analog output signal being provided as the output of the system.

5. A D/A conversion system as claimed in claim 1, further comprising a current source supplying a constant current when an overflow occurs in the result of addition in said adder means, and current summing means for summing the current supplied from said current source and the analog output current of said D/A converter to supply the sum to said output means.

6. A D/A conversion system as claimed in claim 5, wherein said signal applying means includes compensation means for compensating the result of the addition in said adder means when an overflow signal appears from said adder means, and means for applying the compensated output of said compensation means to said D/A converter together with the upper bit portion of the digital input signal applied from said input means.

7. A D/A conversion system as claimed in claim 5, wherein said current source includes means for supplying a constant positive current.

8. A D/A conversion system as claimed in claim 7, further comprising a second current source supplying a constant negative current when the compensation data of negative sign is read out from said memory means at the address corresponding to the upper bit portion of the digital input signal applied from said input means, and means for summing the output current of said current summing means and the output current of said second current source.

* * * * *